US009659733B2

(12) United States Patent
Wu et al.

(10) Patent No.: US 9,659,733 B2
(45) Date of Patent: May 23, 2017

(54) METHOD FOR PREPARING A MOLYBDENUM DISULFIDE FILM USED IN A FIELD EMISSION DEVICE

(71) Applicant: Tsinghua University, Beijing (CN)

(72) Inventors: Huaqiang Wu, Beijing (CN); Shuoguo Yuan, Beijing (CN); Han Li, Beijing (CN); He Qian, Beijing (CN)

(73) Assignee: Tsinghua University, Beijing (CN)

(*) Notice: Subject to any disclaimer, the term of this patent is extended or adjusted under 35 U.S.C. 154(b) by 0 days.

(21) Appl. No.: 14/740,359

(22) Filed: Jun. 16, 2015

(65) Prior Publication Data
US 2016/0108521 A1    Apr. 21, 2016

(30) Foreign Application Priority Data

Apr. 29, 2014    (CN) .......................... 2014 1 0176131

(51) Int. Cl.
C23C 16/30    (2006.01)
H01J 1/304    (2006.01)
(Continued)

(52) U.S. Cl.
CPC ............ H01J 1/304 (2013.01); C23C 16/305 (2013.01); C23C 16/4488 (2013.01);
(Continued)

(58) Field of Classification Search
CPC .......................... C23C 16/305; C23C 16/306
See application file for complete search history.

(56) References Cited

U.S. PATENT DOCUMENTS 4,892,565 A * 1/1990 Schmidt ............ B01D 53/0476
                                                95/101
6,994,550 B2 * 2/2006 Knapp ..................... A61O 5/08
                                                427/2.26
(Continued)

FOREIGN PATENT DOCUMENTS

CN        1592717       3/2005
CN       101224905      7/2008
(Continued)

OTHER PUBLICATIONS

Hussain, Sajjad, et al., "Controlled synthesis and optical properties of polycrystalline molybdenum disulfide atomic layers grown by chemical vapor deposition". Journal of Alloys and Compounds, 653 (2015) 369-378.*

(Continued)

Primary Examiner — Bret Chen
(74) Attorney, Agent, or Firm — Hodgson Russ LLP

(57) ABSTRACT

Method for preparing a molybdenum disulfide film used in a field emission device, including: providing a sulfur vapor; blowing the sulfur vapor into a reaction chamber having a substrate and $MoO_3$ powder to generate a gaseous $MoO_x$; feeding the sulfur vapor into the reaction chamber sequentially, heating the reaction chamber to a predetermined reaction temperature and maintaining for a predetermined reaction time, and then cooling the reaction chamber to a room temperature and maintaining for a second reaction time to form a molybdenum disulfide film on the surface of the substrate, in which the molybdenum disulfide film grows horizontally and then grows vertically. The method according to the present disclosure is simple and easy, and the field emission property of the $MoS_2$ film obtained is good.

9 Claims, 3 Drawing Sheets

(51) Int. Cl.
  *H01J 9/02* (2006.01)
  *C23C 16/448* (2006.01)
  *C23C 16/455* (2006.01)

(52) U.S. Cl.
  CPC ........ *C23C 16/45523* (2013.01); *H01J 9/025* (2013.01); *H01J 2201/30449* (2013.01)

(56) References Cited

U.S. PATENT DOCUMENTS

| | | | | |
|---|---|---|---|---|
| 2003/0044338 A1* | 3/2003 | Giacobbe | B01D 53/229 | 423/247 |
| 2007/0042223 A1* | 2/2007 | Orimo | C01B 3/001 | 428/698 |
| 2012/0086331 A1* | 4/2012 | Kobayashi | H01L 51/504 | 313/504 |
| 2014/0245946 A1* | 9/2014 | Kong | C30B 25/186 | 117/95 |
| 2014/0251204 A1* | 9/2014 | Najmaei | C30B 25/04 | 117/95 |
| 2014/0353166 A1* | 12/2014 | Iezzi | B01J 37/0238 | 205/638 |
| 2015/0064471 A1* | 3/2015 | Dresselhaus | C23C 14/12 | 428/408 |

FOREIGN PATENT DOCUMENTS

| | | |
|---|---|---|
| CN | 101234785 | 8/2008 |
| CN | 103194729 | 7/2013 |
| JP | 2004-277199 | * 10/2004 |

OTHER PUBLICATIONS

Ling, Xi, et al., "Role of the Seeding Promoter in MoS2 Growth by Chemical Vapor Deposition". Nano Letters 2014, 14, 464-472.*

Wang, Jiao, et al., "Direct growth of molybdenum disulfide on arbitrary insulating surface by chemical vapor deposition." RSC Advances, 2015, 5, pp. 4364-4367.*

Lee, Yi-Hsien, et al., "Synthesis of Large-Area MoS2 Atomic Layers with Chemical Vapor Deposition". pp. 1-9. No additional citation data is available.*

* cited by examiner (a)

(b)

(a)

(b)

METHOD FOR PREPARING A MOLYBDENUM DISULFIDE FILM USED IN A FIELD EMISSION DEVICE

FIELD

The present disclosure relates to a chemical vapor deposition technical field, more particularly, to a method for preparing a molybdenum disulfide film used in a field emission device.

BACKGROUND

A field emission (FE) process is a phenomenon that a high-intensity electric field is applied on the surface of a metal or semiconductor and the like, and then electrons enter into vacuum by a tunnel effect. A cold cathode of the field emission has an advantage of low power consumption and rapid speed of response compared with a thermionic electron emission.

A high-melting-point metal such as $M_o$, W and semiconductor materials like Si are commonly adopted as an early field emission cathode material, and the cathode material is produced into a pointed cone shape so as to reduce an external electric field intensity needed. However, these cathode materials have disadvantages of low emission current, unstable performance, complex preparation process, and high cost, so these cathode materials cannot be applied in practice. A film edge structure has a greater field enhancement and a less screening effect than that a wedge structure, which is more beneficial for the field emission. Moreover, this structure is simpler than the wedge structure in terms of the production method and the process, but the process condition of the structure determines that an emitter of the structure usually lies flat on a substrate, which limits the range of application to some extent. If a nanostructure grows vertically on the substrate, the material will have a higher length-diameter ratio. This unique nanostructure has not only a high length-diameter ratio, but also a large specific surface area, so this nanostructure can become a good field emission material. In addition, since the edges of the two-dimensional materials, for example $MoS_2$, consist of many electrons, the two-dimensional material of the nanostructure is considered as one of the most promising field emission materials.

Recently, crystalline materials of transition material chalcogenides (TMD), for example, $MoS_2$, are highly valued in academia and industrial community. Although the materials have poor electron fluidity because a monomolecular layer of such materials has an intrinsic large band gap, mobility of the monolayer TMD material is greatly enhanced at room temperature by a gate of oxide layer medium during producing a transistor. Many unique electrical and optical properties are incarnated after degradation of bulk materials into monomolecular layer materials, and such materials become one of crucial materials in advanced international research of a new high-performance nanometer device. Besides an advantage of small volume, the TMD is lower in energy consumption than silicon widely used. The energy consumption of the field effect transistor prepared by TMD materials represented by the $MoS_2$ is 100000 times less than a conventional silicon transistor under a stable state.

Currently, the preparation of the $MoS_2$ film mainly focuses on mechanical exfoliation, liquid phase stripping and so on. However, the number of film layers prepared by this method is not controllable, and these layers all show a nanostructure such as a tiled $MoS_2$ nanosheet, nanodisk, nanoline in a microcosmic view, and obtains a small area. The two-dimensional atomic crystalline material suitable for high-property field emission devices has rarely been studied.

SUMMARY

Embodiments of the present disclosure seek to solve at least one of the problems existing in the related art to at least some extents. Therefore, a method for preparing a molybdenum disulfide film used in a field emission device and having good field emission property is provided.

A method for preparing a molybdenum disulfide film used in a field emission device according to embodiments of the present disclosure, includes: providing a sulfur vapor; blowing the sulfur vapor into a reaction chamber having a substrate and $MoO_3$ powder, so as to make the $MoO_3$ powder react with the sulfur vapor to generate a gaseous $MoO_x$ which deposits on the substrate, in which x is $2 \leq x < 3$; feeding the sulfur vapor into the reaction chamber sequentially, heating the reaction chamber to a predetermined reaction temperature and maintaining for a predetermined reaction time, and then cooling the reaction chamber to a room temperature, so as to make the sulfur vapor and the $MoO_x$ form a molybdenum disulfide film on the surface of the substrate, in which the molybdenum disulfide film grows horizontally and then grows vertically.

The $MoS_2$ film obtained by the method for preparing a molybdenum disulfide film used in a field emission device according to the embodiments of the present disclosure has a two-dimensional plane structure in a macroscopic view, and a plurality of the $MoS_2$ nanostructures growing vertically in a microscopic view. Therefore the $MoS_2$ film has a great specific surface area and plentiful edges of space geometry. Since a strong local electric field is usually formed at the edge of the surface (which is caused by a charge distribution characteristic), the external electric field necessary for the material field emission can be reduced effectively. Therefore, the field emission property of the $MoS_2$ film obtained by the method of the present disclosure is good. The method of the present disclosure is advantageously easy and simple to be conducted.

According to an embodiment of the present disclosure, the predetermined reaction temperature ranges from 600° C. to 900° C.

According to an embodiment of the present disclosure, the predetermined reaction time ranges from 5 minutes to 30 minutes.

According to an embodiment of the present disclosure, the sulfur vapor is obtained by sublimating a sulfur powder.

According to an embodiment of the present disclosure, the sulfur vapor is blown into the reaction chamber via a carrier gas.

According to an embodiment of the present disclosure, the carrier gas is high-purity nitrogen, a high-purity inactive gas or an inactive gas with doping hydric.

According to an embodiment of the present disclosure, a flow velocity of the carrier gas ranges from 1 sccm to 100 sccm.

According to an embodiment of the present disclosure, a distance between a blowing entrance of the sulfur vapor and a location of the $MoO_3$ powder ranges from 5 cm to 30 cm.

According to an embodiment of the present disclosure, a cooling rate in a cooling process ranges from 5° C./min to 200° C./min.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE VIEWS

These and other aspects and advantages of embodiments of the present disclosure will become apparent and more readily appreciated from the following descriptions made with reference to the views, in which.

DETAILED DESCRIPTION

Figure 1:
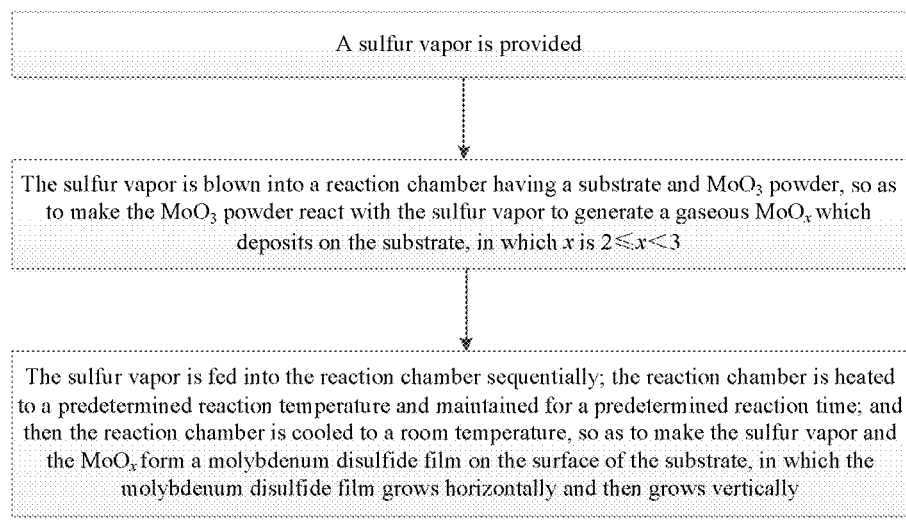
FIG. 1 is a flow chart of a method for preparing a molybdenum disulfide film used in a field emission device according to embodiments of the present disclosure.

Reference will be made in detail to embodiments of the present disclosure. Embodiments of the present disclosure will be shown in drawings, in which the same or similar elements and the elements having same or similar functions are denoted by like reference numerals throughout the descriptions. The embodiments described herein according to drawings are explanatory and illustrative, not construed to limit the present disclosure.

In a first aspect of the present disclosure, a method for preparing a molybdenum disulfide film used in a field emission device is provided. As shown in FIG. 1, the method includes the following steps:

a) A sulfur vapor is provided.

Specifically, the sulfur vapor may be obtained by sublimating a sulfur powder.

b) The sulfur vapor is blown into a reaction chamber having a substrate and $MoO_3$ powder, so as to make the $MoO_3$ powder react with the sulfur vapor to generate a gaseous $MoO_x$ which deposits on the substrate, in which x is 2≤x<3.

Specifically, the sulfur vapor may be blown into reaction chamber via a carrier gas. The carrier gas may be selected from high-purity nitrogen, a high-purity inactive gas or an inactive gas with doping hydric. A flow velocity of the carrier gas should range from 1 sccm to 100 sccm. The distance between a blowing entrance of the sulfur vapor and a location of the $MoO_3$ powder may range from 5 cm to 30 cm. If the distance is too short, the reaction may happen before reaching the predetermined reaction temperature, which is not beneficial to the growth of molybdenum disulfide films. If the distance is too long, it is difficult to contact and react with $MoO_3$ powder.

c). The sulfur vapor is fed into the reaction chamber sequentially; the reaction chamber is heated to a predetermined reaction temperature and maintained for a predetermined reaction time; and then the reaction chamber is cooled to a room temperature, so as to make the sulfur vapor and the $MoO_x$ form a molybdenum disulfide film on the surface of the substrate, in which the molybdenum disulfide film grows horizontally and then grows vertically.

Specifically, the reaction chamber is heated to a predetermined reaction temperature, such that $MoO_x$ reacts with S steam to form a thin layer of $MoS_2$ by means of plane nucleation, and then a new nucleation point is formed by the preliminary formed $MoS_2$ due to a defect and strain in the growing process. After that, the temperature is cooled to room temperature, and $MoS_2$ further grows vertically on the new nucleation point. In other words, the molybdenum disulfide film is formed in a manner of growing horizontally and then growing vertically.

The $MoS_2$ film obtained by the method for preparing a molybdenum disulfide film used in a field emission device according to the embodiments of the present disclosure has a two-dimensional plane structure in a macroscopic view, and a plurality of the $MoS_2$ nanostructures growing vertically in a microscopic view. Therefore the $MoS_2$ film has a great specific surface area and plentiful edges of space geometry. Since a strong local electric field is usually formed at the edge of the surface (which is caused by a charge distribution characteristic), the external electric field necessary for the material field emission can be reduced effectively. Therefore, the field emission property of the $MoS_2$ film obtained by the method of the present disclosure is good. The method of the present disclosure is advantageously easy and simple to be conducted.

In an embodiment of the present disclosure, the predetermined reaction temperature may range from 600° C. to 900° C. If the temperature is too low, it will be difficult to form the $MoS_2$ film. If the temperature is too high, it will be difficult to grow the $MoS_2$ in the vertical direction. In an embodiment of the present disclosure, the predetermined reaction time ranges from 5 minutes to 30 minutes. If the time is too short, the height of the $MoS_2$ nanostructure which grows vertically will be low, resulting in poor field emission property. If the time is too long, the $MoS_2$ film growing horizontally becomes thick, and the film is not a monomolecular layer film any more, and the number of the $MoS_2$ nanostructures growing vertically therein become few, and the film field emission property becomes low.

In an embodiment of the present disclosure, the cooling rate in the cooling process ranges from 5° C./min to 200° C./min The temperature may be lowered to the room temperature by natural and slow cooling or accelerated cooling. The faster the cooling is, the more defects the $MoS_2$ film growing on the substrate has, and the defects will become new nucleating points, such that the number of the $MoS_2$ nanostructures growing vertically become larger, thus the electric current density of field emission of the device prepared thereof is greater.

The present disclosure will be described in detail with reference to specific examples for better understanding.

First, an OTF-1200X type of a vacuum tube furnace was selected, a porcelain plate loaded with $MoO_3$ powder was placed in the bottom center of a reaction chamber, and a silicon substrate was oppositely fixed on right above the porcelain plate, i.e. in the top center of the reaction chamber. Another porcelain plate loaded with S powder was placed away from the porcelain plate loaded with the $MoO_3$ powder by 10 cm in an up direction, in which the "up direction" referred to an upstream direction of the gas flowing direction in the reaction chamber. Then high-purity nitrogen was fed to discharge the air in the reaction chamber, and then the temperature rose to 100° C. and maintained for 15 minute. Later, the temperature of the reaction chamber was raised to 750° C. and maintained for 5 minute. The temperature was rapidly reduced to the room temperature, then the sample was taken out and characterization was carried out in many ways.

Figure 2:
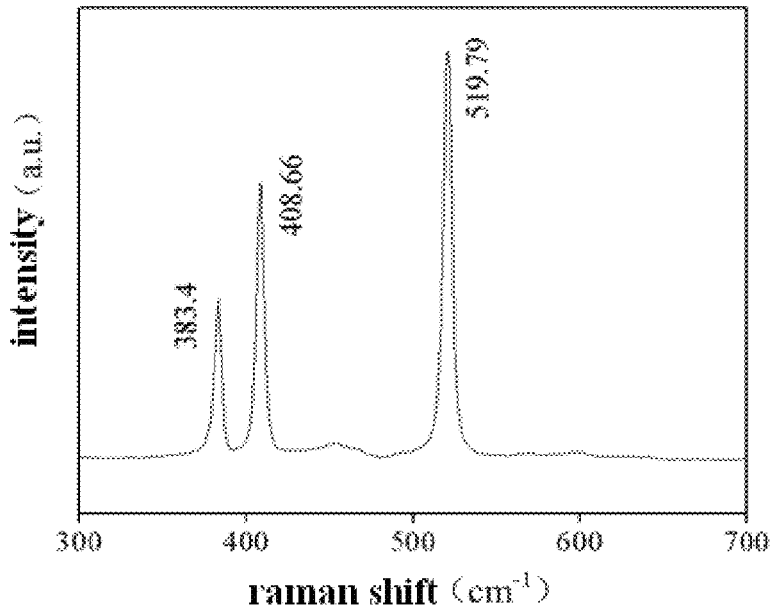
FIG. 2 is a Raman spectrogram of a molybdenum disulfide film prepared by a method according to embodiments of the present disclosure.

Raman graph (Raman spectrogram) of the sample is shown in FIG. 2. In the figure, it is obvious that two main Raman peaks of the $MoS_2$ film are $E_{2g}$ peak in 383.4 $cm^{-1}$, and $A_{1g}$ peak in 408.6 $cm^{-1}$ respectively. It is demonstrated that the film is $MoS_2$ film. In addition, Si peak in 520 $cm^{-1}$ of the substrate is also shown in the figure.

Figure 3:
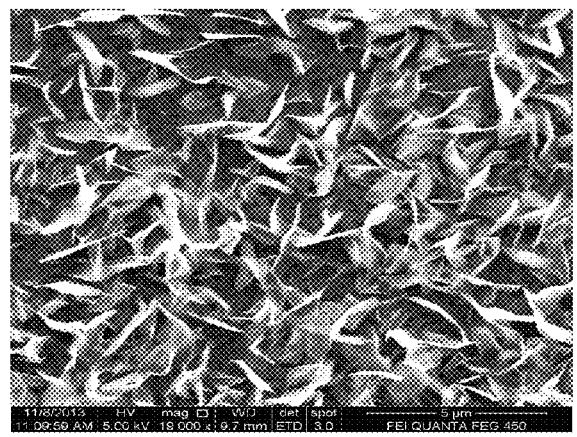
FIG. 3 is SEM image of a molybdenum disulfide film prepared by a method according to embodiments of the present disclosure, in which (a) is an overall view, and (b) is a partially enlarged view.
Figure 3:
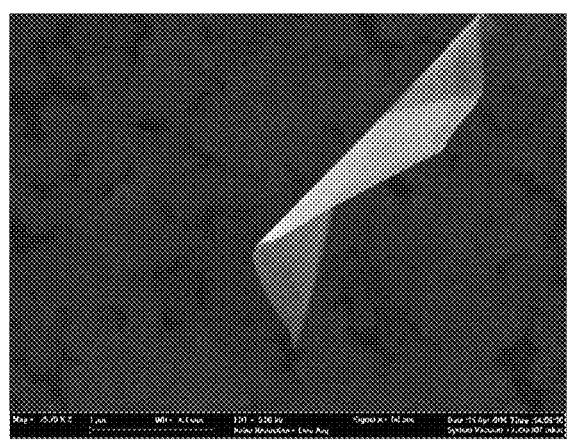
Figure 4:
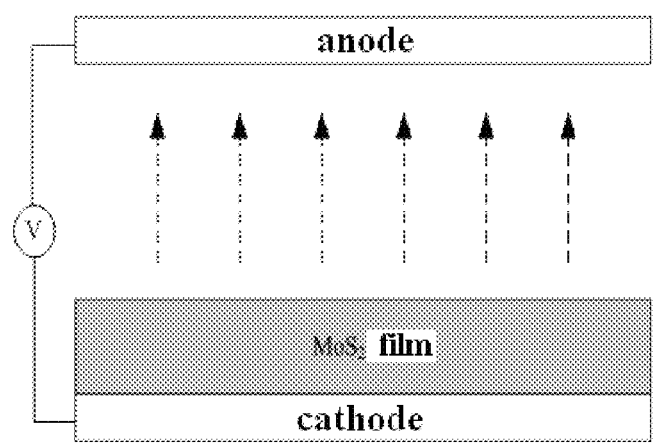
FIG. 4 is a schematic diagram of a process of testing filed emission property of a molybdenum disulfide film obtained by a method according to embodiments of the present disclosure.
Figure 5:
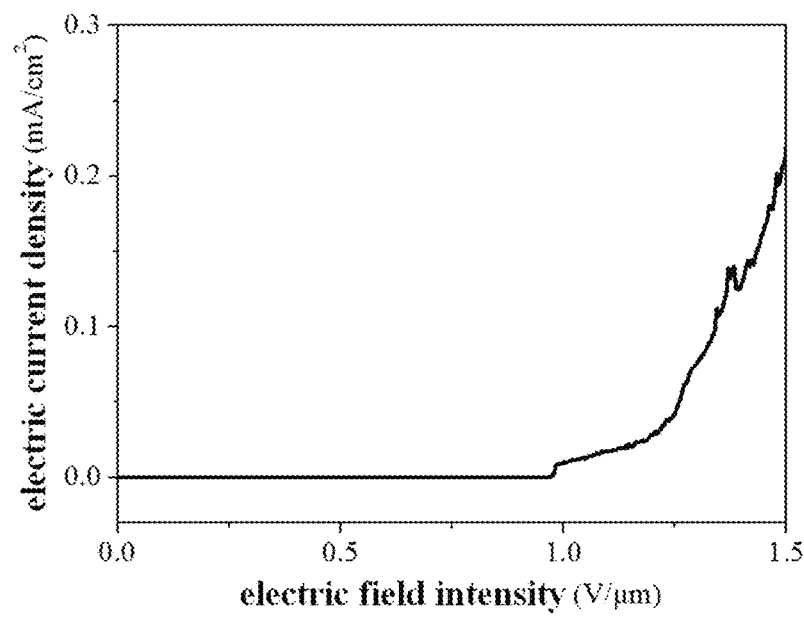
FIG. 5 is a graph of a result of testing field emission property of a molybdenum disulfide film obtained by a method according to embodiments of the present disclosure, in which (a) is a testing curve of a molybdenum disulfide film sample obtained by fast cooling, and (b) is a testing curve of a molybdenum disulfide film sample obtained by slow cooling.
Figure 5:
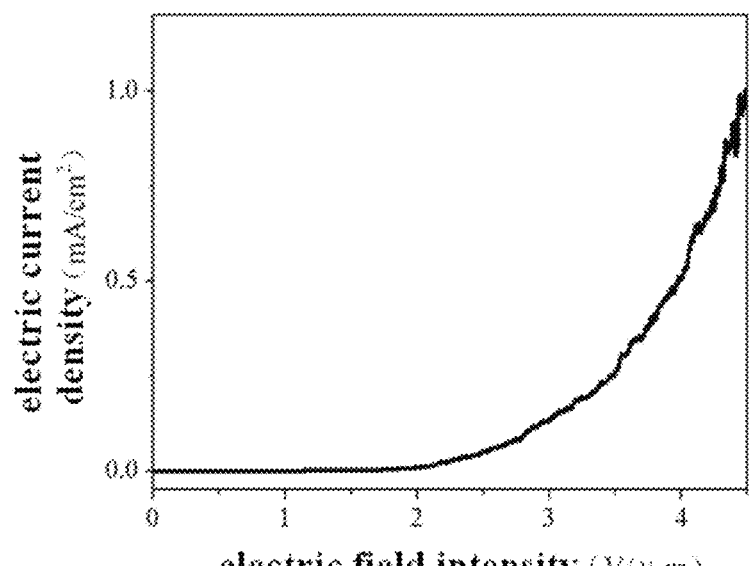

FIG. 3 shows a SEM (scanning electron microscope) image of the sample, in which (a) is an overall view, and (b) is a partially enlarged view. The $MoS_2$ film formed by growing horizontally and then growing vertically is shown in the figure. FIG. 3(b) shows that the $MoS_2$ nanostructure has a bottom size of about 3×0.1 μm and a vertical height of 0.2 μm. The molybdenum disulfide film obtained was stuck on a cathode electrode in a pair of plane electrodes deposited relatively, and the field emission property of the film was tested as shown in FIG. 4. FIG. 5 shows a field emission property graph of the molybdenum disulfide film samples obtained in different chilling velocities. It can be seen from the figure that the $MoS_2$ film has a lower turn-on electric field and a higher electric current density. FIG. 5(a) is a test curve of the molybdenum disulfide film obtained by fast cooling (the cooling rate is about 170° C./min), while FIG. 5(b) is a test curve of the molybdenum disulfide film obtained by slow cooling (the cooling rate is about 6° C./min) It can be seen from the FIG. 5(a) that the $MoS_2$ film has a lower turn-on electric field (1 V/μm). It can be seen from the FIG. 5(b) that the $MoS_2$ film has a higher electric current density (1 mA/$cm^2$).

In order to make a person skilled in the art understand the effect of the present disclosure better, a principle that the $MoS_2$ film growing horizontally and then growing vertically according to the present disclosure is suitable for the field emission device will be further illustrated.

The field emission is an effective electric emission. The field emission refers to a phenomenon that the height and width of surface potential barrier of a material are reduced simultaneously under the action of a high electric field, and electrons in the material are emitted to vacuum via a tunnel. The fundamental principle of the field emission is that the surface potential barrier of the emitting material is reduced by utilizing an external electric field—lowering the potential barrier height and narrowing the potential barrier width. A tunnel effect began to appear when the potential barrier width is approximate to the electron wavelength, and the electron in the material penetrated the surface potential barrier and entered into vacuum by the tunnel effect.

With the method for preparing a molybdenum disulfide film used in a field emission device according to the present disclosure, the $MoS_2$ film with a plurality of $MoS_2$ nanostructures whose bottom is fixed on the plane substrate and whose top is extended towards a vertical direction is obtained by means of growing horizontally and then growing vertically. Therefore the $MoS_2$ film has a great specific surface area and plentiful edges of space geometry. Since a strong local electric field is usually formed at the edge of the surface (which is caused by a charge distribution characteristic), the external electric field necessary for the material field emission can be reduced effectively. Therefore, the field emission property of the $MoS_2$ film obtained by the method of the present disclosure is good.

In the description of the present disclosure, it is to be understood that terms such as "central," "longitudinal," "lateral," "length," "width," "thickness," "up," "down," "front," "rear," "left," "right," "vertical," "horizontal," "top," "bottom," "inner," "outer," "clockwise," "anticlockwise" and so on should be construed to refer to the orientation or position as shown in the drawings under discussion. These relative terms are for convenience of description and do not indicate or imply that the apparatus or members must have a particular orientation or be constructed and operated in a particular orientation. Therefore, these terms shall not be construed to limit the present disclosure.

In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; or may be mechanical or electrical connections; or may be direct connections or indirect connections via intervening structures; may also be inner communications of two elements, which can be understood by those skilled in the art according to specific situations.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. The appearances of the phrases throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, amendments, alternatives, and modifications can be made in the embodiments without departing from spirit, principles and scope of the present disclosure.

What is claimed is:

1. A method for preparing a molybdenum disulfide film used in a field emission device, comprising:
   providing a sulfur vapor;
   blowing the sulfur vapor into a reaction chamber having a substrate and $MoO_3$ powder, so as to make the $MoO_3$ powder react with the sulfur vapor to generate a gaseous $MoO_x$ which deposits on the substrate, in which x is 2≤x<3;
   feeding the sulfur vapor into the reaction chamber sequentially, heating the reaction chamber to a predetermined reaction temperature and maintaining for a predetermined reaction time, and then cooling the reaction chamber to a room temperature, so as to make the sulfur vapor and the $MoO_x$ form a molybdenum disulfide film on the surface of the substrate, in which the molybdenum disulfide film grows horizontally and then grows vertically.

2. The method according to claim 1, wherein the predetermined reaction temperature ranges from 600° C. to 900° C.

3. The method according to claim 1, wherein the predetermined reaction time ranges from 5 minutes to 30 minutes.

4. The method according to claim 1, wherein the sulfur vapor is obtained by sublimating sulfur powder.

5. The method according to claim 1, wherein the sulfur vapor is blown into the reaction chamber via a carrier gas.

6. The method according to claim 5, wherein the carrier gas is nitrogen, an inactive gas or an inactive gas with doping hydric.

7. The method according to claim 5, wherein a flow velocity of the carrier gas ranges from 1 sccm to 100 sccm.

8. The method according to claim 1, wherein a distance between a blowing entrance of the sulfur vapor and a location of the $MoO_3$ powder ranges from 5 cm to 30 cm.

9. The method according to claim 1, wherein a cooling rate in a cooling process ranges from 5° C/min to 200° C/min.

\* \* \* \* \*